United States Patent
Mori et al.

(10) Patent No.: US 9,854,224 B2
(45) Date of Patent: Dec. 26, 2017

(54) IMAGE PROCESSING APPARATUS, IMAGE CAPTURING APPARATUS, AND IMAGE PROCESSING PROGRAM

(75) Inventors: Susumu Mori, Tokyo (JP); Muneki Hamashima, Fukaya (JP); Kiyoshige Shibazaki, Higashimurayama (JP)

(73) Assignee: NIKON CORPORATION, Tokyo (JP)

( * ) Notice: Subject to any disclaimer, the term of this patent is extended or adjusted under 35 U.S.C. 154(b) by 303 days.

(21) Appl. No.: 14/008,838

(22) PCT Filed: Mar. 12, 2012

(86) PCT No.: PCT/JP2012/001704
§ 371 (c)(1),
(2), (4) Date: Oct. 28, 2013

(87) PCT Pub. No.: WO2012/132270
PCT Pub. Date: Oct. 4, 2012

(65) Prior Publication Data
US 2014/0055571 A1    Feb. 27, 2014

(30) Foreign Application Priority Data
Mar. 30, 2011    (JP) .................. 2011-076408

(51) Int. Cl.
*H04N 13/02* (2006.01)
*H04N 5/335* (2011.01)
(Continued)

(52) U.S. Cl.
CPC ......... *H04N 13/0239* (2013.01); *G03B 35/08* (2013.01); *H04N 5/335* (2013.01);
(Continued)

(58) Field of Classification Search
CPC . H04N 13/0257; H04N 13/0239; H04N 5/335
(Continued)

(56) References Cited

U.S. PATENT DOCUMENTS 6,225,244 B1 * 5/2001 Oguma .................... C03C 3/16
                                                          501/45
8,049,805 B2    11/2011 Fukuyoshi et al.
(Continued)

FOREIGN PATENT DOCUMENTS

| CN | 101449381 A | 6/2009 |
| JP | A-8-47001 | 2/1996 |
| JP | 2003-007994 A | 1/2003 |

OTHER PUBLICATIONS

Aug. 2, 2016 Office Action issued in Chinese Application No. 201280012222.4.
(Continued)

*Primary Examiner* — Gims Philippe
*Assistant Examiner* — Mainul Hasan
(74) *Attorney, Agent, or Firm* — Oliff PLC

(57) ABSTRACT

Images can be processed using an image processing apparatus including: an image data obtaining section that obtains at least two pieces of parallax image data from an image capturing element that includes color filters and opening masks so that one color filter and one opening mask correspond to one of at least a part of photoelectric conversion elements and outputs the at least two pieces of parallax image data; and a correcting section that corrects color imbalance of a corresponding pixel caused between the at least two pieces of parallax image data, based on at least one of a position of the at least a part of photoelectric conversion elements in the image capturing element and an opening displacement of the opening mask.

16 Claims, 15 Drawing Sheets

(51) Int. Cl.
*G03B 35/08* (2006.01)
*H04N 9/04* (2006.01)
*H04N 5/367* (2011.01)

(52) U.S. Cl.
CPC ......... *H04N 9/045* (2013.01); *H04N 13/0217* (2013.01); *H04N 13/0257* (2013.01); *H04N 5/367* (2013.01)

(58) Field of Classification Search
USPC .......................................................... 348/47
See application file for complete search history.

(56) References Cited

U.S. PATENT DOCUMENTS

| 2003/0071271 | A1 | 4/2003 | Suzuki et al. | |
| 2007/0285553 | A1* | 12/2007 | Morita | H04N 5/2254 |
| | | | | 348/335 |
| 2009/0128658 | A1* | 5/2009 | Hayasaka | H04N 5/225 |
| | | | | 348/222.1 |

OTHER PUBLICATIONS

Nov. 26, 2015 Office Action issued in Chinese Patent Application No. 201280012222.4.

* cited by examiner

⟨1⟩n=2

| REPETITIVE PATTERN CLASSIFICATION | | EXISTENCE/NON-EXISTENCE OF PARALLAX PIXEL | | | PARALLAX PIXEL | PARALLAX ARRAY | CHARACTERISTICS |
|---|---|---|---|---|---|---|---|
| | | Gr | Gb | R, B | | | |
| CLASSIFICATION A | A-1 | EXIST | EXIST | NOT EXIST | Gr AND Gb ALTERNATE | Gr ROW Gr, Gb ROW Gb | THE IMAGE QUALITY OF 2D IMAGE CAN BE MAINTAINED TO SOME EXTENT, WHILE OBTAINING A 3D IMAGE |
| | A-2 | | | | | Gr COLUMN Gr, Gb COLUMN Gb | |
| CLASSIFICATION B | B-1 | EXIST (NOT EXIST) | NOT EXIST (EXIST) | NOT EXIST | ONLY ONE PIXEL OF Gr (OR Gb) | Gr ROW Gr | HIGH RESOLUTION IS MAINTAINED IN 2D IMAGE, WHILE OBTAINING 3D INFORMATION |
| | B-2 | | | | | Gb COLUMN Gb (OR Gr COLUMN Gr) | |
| CLASSIFICATION C | C-1 | EXIST | EXIST | NOT EXIST | EACH TWO PIXELS OF Gr, Gb | Gr ROW Gr, Gb ROW Gb | OBTAINING 3D COLOR IMAGE HAVING FAIRLY HIGH RESOLUTION AND 2D IMAGE WITH SOMEWHAT LOW RESOLUTION |
| | C-2 | | | | | Gr COLUMN Gr, Gb COLUMN Gb | |
| CLASSIFICATION D | D-1 | EXIST | NOT EXIST | EXIST | EACH THREE PIXELS OF Gr, R, B | Gr ROW Gr, R, Gb ROW B | OBTAINING 3D COLOR IMAGE WITH SUFFICIENT IMAGE QUALITY WHILE ALSO OBTAINING INFORMATION ON 2D IMAGE |
| | D-2 | | | | | Gr COLUMN Rr, Gb COLUMN Gb, B | |
| CLASSIFICATION E | E-1 | EXIST | EXIST | EXIST | EACH FOUR PIXELS OF Gr, Gb, R, B | Gr ROW Gr, R, Gb ROW B, Gb | OBTAINING 3D COLOR IMAGE HAVING THE HIGHEST QUALITY WITH REDUCED RESOLUTION |
| | E-2 | | | | | Gr COLUMN R, Gr Gb COLUMN Gb, B | |

*FIG. 10*

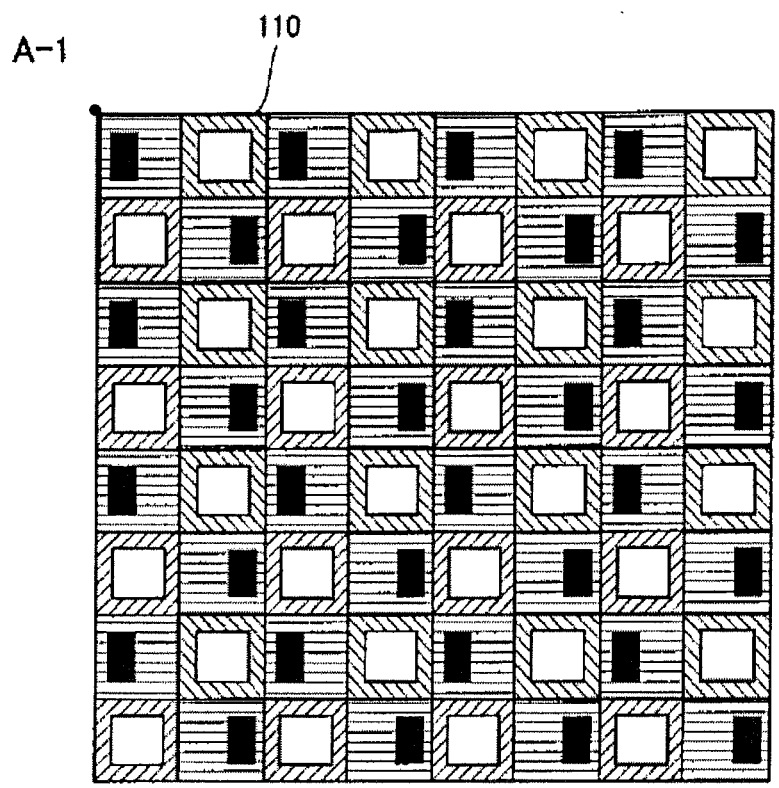
 NON-PARALLAX PIXEL
 PARALLAX L PIXEL
 PARALLAX R PIXEL
*FIG. 11*

D-1
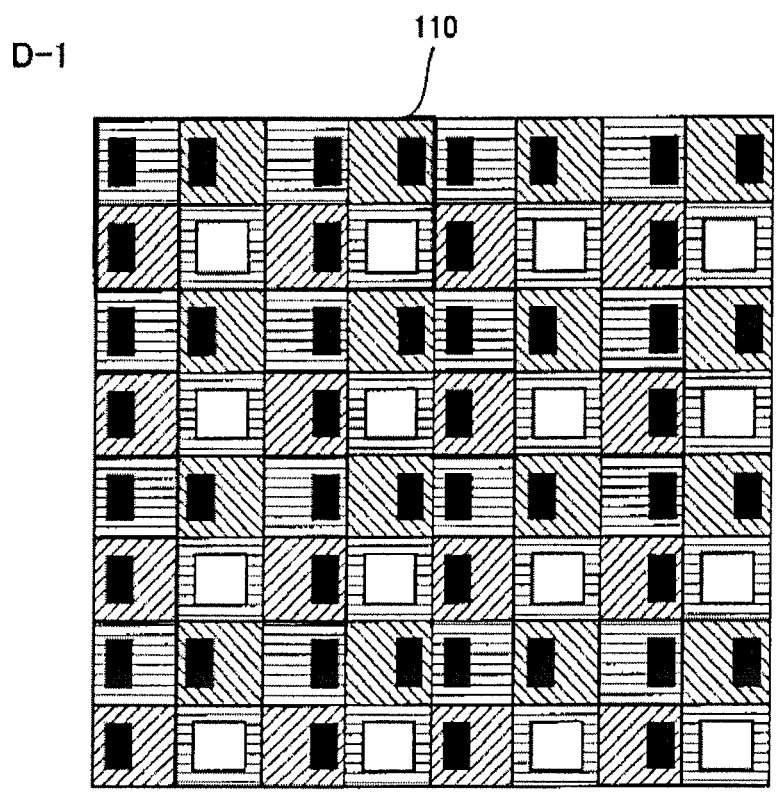
 NON-PARALLAX PIXEL
 PARALLAX L PIXEL
 PARALLAX R PIXEL
FIG. 13

US 9,854,224 B2

IMAGE PROCESSING APPARATUS, IMAGE CAPTURING APPARATUS, AND IMAGE PROCESSING PROGRAM

TECHNICAL FIELD

The contents of the following Japanese and International patent applications are incorporated herein by reference:
 No. 2011-076408 filed in JP on Mar. 30, 2011, and
 No. PCT/JP2012/001704 on Mar. 12, 2012.

The present invention relates to an image processing apparatus, an image capturing apparatus, and an image processing program.

RELATED ART

A stereo image capturing apparatus capturing a stereo image made of a right-eye image and a left-eye image using two image-capturing optical systems has been known. Such a stereo image capturing apparatus generates parallax between two images by capturing images of the same subject using two image-capturing optical systems arranged with a certain interval therebetweeen.
Patent Document No. 1: Japanese Patent Application Publication No. H8-47001

SUMMARY

When a right-eye image and a left-eye image are obtained using two image capturing systems independent from each other, the difference in incident angle at which the subject light flux is incident on each image capturing element can be practically ignored. However, when generating a plurality of parallax images using an image signal outputted from a single image capturing system at a single lithographic exposure operation, there has been different tones of color between the parallax images due to the difference in incident angle at which the subject light flux is incident on the each pixel of the image capturing element.

According to a first aspect of the innovations herein, provided is an image processing apparatus including: an image data obtaining section that obtains at least two pieces of parallax image data from an image capturing element that includes color filters and opening masks so that one color filter and one opening mask correspond to one of at least a part of photoelectric conversion elements and that outputs the at least two pieces of parallax image data; and a correcting section that corrects color imbalance of a corresponding pixel caused between the at least two pieces of parallax image data, based on at least one of a position of the at least a part of photoelectric conversion elements in the image capturing element and an opening displacement of the opening mask.

According to a second aspect of the innovations herein, provided is an image capturing apparatus including the image processing apparatus and the image capturing element, where in the image capturing element, an opening of each of the opening masks provided to correspond to at least three of n adjacent photoelectric conversion elements (n being an integer equal to or greater than 3) is included in one of color filter patterns constituted by at least two types of the color filters that transmit wavelength regions different from each other, and is located to pass each of light fluxes from partial regions different from each other in a sectional area of incident light, and a group of photoelectric conversion elements made of the n adjacent photoelectric conversion elements are arranged periodically, and the image capturing apparatus outputting the parallax image data based on an output signal of the photoelectric conversion elements for which the opening masks are provided.

According to a second aspect of the innovations herein, provided is an image processing program that makes a computer implement a procedure including: obtaining at least two pieces of parallax image data from an image capturing element that includes color filters and opening masks so that one color filter and one opening mask correspond to one of at least a part of photoelectric conversion elements and that outputs the at least two pieces of parallax image data; and correcting color imbalance of a corresponding pixel caused between the at least two pieces of parallax image data, based on at least one of a position of the at least a part of photoelectric conversion elements in the image capturing element and an opening displacement of the opening mask.

The summary clause does not necessarily describe all necessary features of the embodiments of the present invention. The present invention may also be a sub-combination of the features described above.

BRIEF DESCRIPTION OF THE DRAWINGS

FIG. 10 explains various examples in which parallax pixels are allocated to a Bayer array when there are two kinds of parallax pixels.

FIG. 11 shows an example of a different variation.

FIG. 13 shows an example of a different variation.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

A digital camera according to the present embodiment, which is one embodiment of an image capturing apparatus, is configured to generate images corresponding to a plurality of view points for one scene. Images taken from different view points are referred to as "parallax image."

Figure 1:
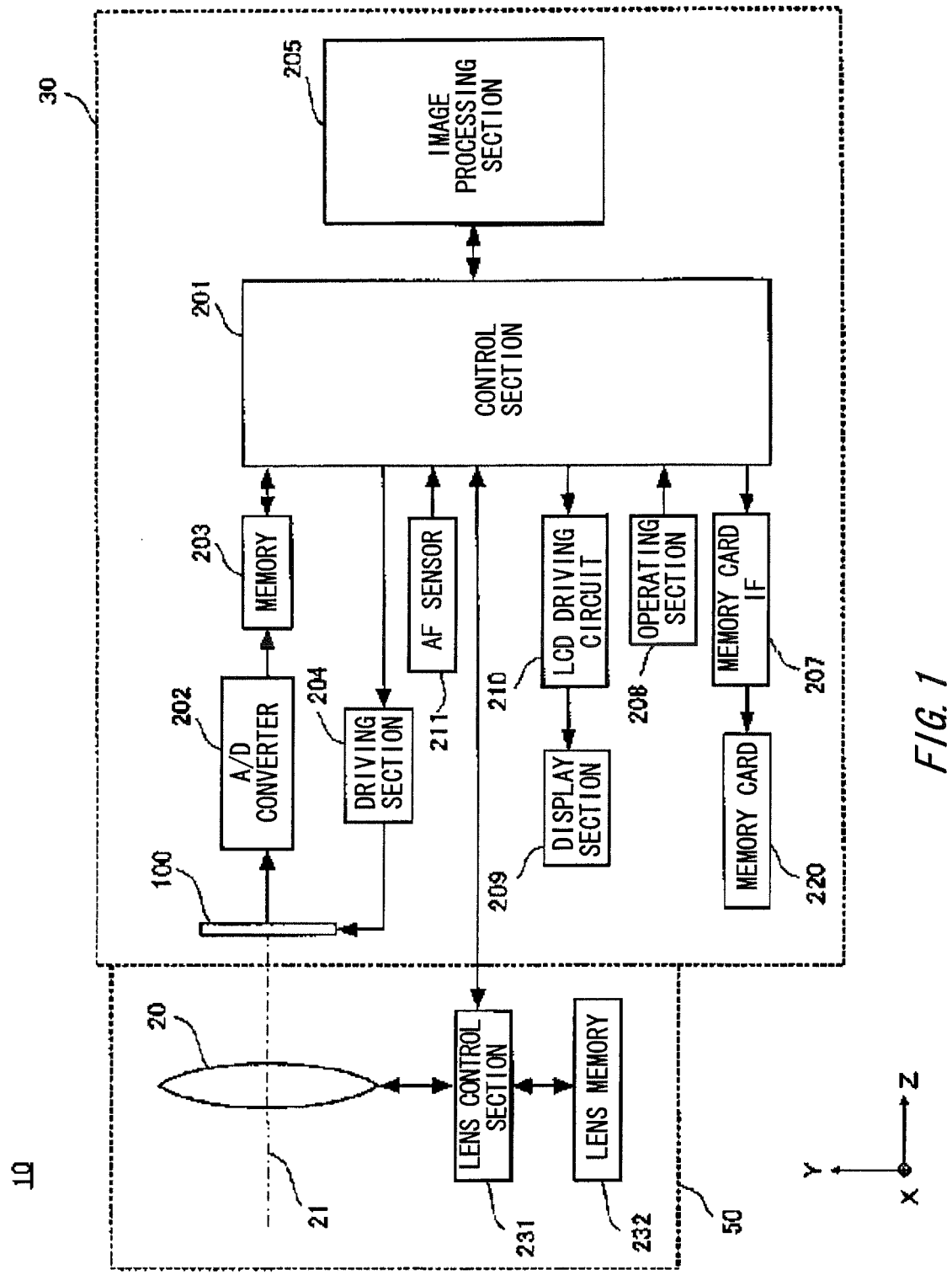
FIG. 1 is a diagram showing the configuration of a digital camera according to an embodiment of the present invention.

FIG. 1 is a diagram showing the configuration of a digital camera 10 according to an embodiment of the present invention. The digital camera 10 is configured by a main-body unit 30, and a lens unit 50 detacheable with respect to the main-body unit 30. The image-capturing lens 20 included in the lens unit 50 guides a subject light flux incident along the optical axis 21 towards the image-capturing element 100 of the main-body unit 30. In the present embodiment, the digital camera 10 is explained as a lens exchangeable camera from which the lens unit 50 can be detached. However, the digital camera 10 can also be a camera in which the lens unit 50 is integrally made with the main-body unit 30.

The main-body unit 30 includes an image-capturing element 100, a control section 201, an A/D converter 202 a memory 203, a driving section 204, an image processing section 205, a memory card IF 207, an operating section 208, a display section 209, an LCD driving circuit 210, and an AF sensor 211. The lens unit 50 includes a lens control section 231 and a lens memory 232 in addition to the image-capturing lens 20.

Note that as shown in this drawing, the direction parallel to the optical axis 21 towards the image-capturing element 100 is determined as z-axis plus direction, and the direction towards the front side of the paper in which the drawing is drawn on the plane orthogonal to the z-axis is defined as the x-axis plus direction, and the upper direction of the paper is determined as the y-axis plus direction. In some of the drawings that follow, the coordinates axes are shown to clarify the orientations of the drawings with reference to the coordinates axis of FIG. 1.

The image-capturing lens 20 is made up of a plurality of optical lens groups, and forms an image of the subject light flux from a scene, in the vicinity of the focus plane. Note that the image-capturing lens 20 in FIG. 1 is represented by a virtual single lens provided in the vicinity of the pupil. The image-capturing element 100 is provided in the vicinity of the focus plane of the image-capturing lens 20. The image-capturing element 100 is an image sensor (e.g., CCD, CMOS sensor) in which a plurality of photoelectric conversion elements are arranged two dimensionally. The driving section 204 controls the timing of the image capturing element 100 at which the image capturing element 100 converts a subject image formed on the light receiving plane and outputs it to the A/D converter 202.

The A/D converter 202 converts the image signal outputted from the image capturing element 100 into a digital image signal, and outputs it to a memory 203. The image processing section 205 performs various types of image processing using the memory 203 as a workspace, thereby generating image data. The image processing section 205 also has such a function as generating 2D image data as non-parallax image data and parallax image data from an inputted image signal in accordance with the pixel array of the image capturing element 100, and adjusting the image data according to the selected image format. The generated image data can be converted to a display signal by the LCD driving circuit 210, and displayed to the display section 209. The generated image data can also be recorded in the memory card 220 mounted to the memory card IF 207.

The AF sensor 211 is a phase difference sensor that sets a plurality of ranging points for the subject space, and detects an amount of defocus of the subject image at each ranging point. A series of image capturing sequences starts by the operating section 208 receiving an operation from a user, and outputting an operating signal to the control section 201. Various operations such as AF and AE related to the image capturing sequences are executed under control of the control section 201. For example, the control section 201 analyzes a detection signal of the AF sensor 211 and transmits a focus control signal for moving the focus lens making up a part of the image capturing lens 20, to the lens control section 231.

The lens control section 231 controls the lens unit 50. For example, the lens control section 231 receives the focus control signal from the control section 201, and moves the focus lens. In addition, the lens control section 231 detects the current position of the image capturing lens 20 including the focus lens and transmits it to the control section 201. The lens memory 232 is a nonvolatile memory storing therein various types of property values related to the lens unit 50. In response to the request from the control section 201, the lens control section 231 transmits, to the control section 201, the positional information of the image capturing lens 20, various types of property values stored in the lens memory 232, or the like as lens information.

Figure 2:
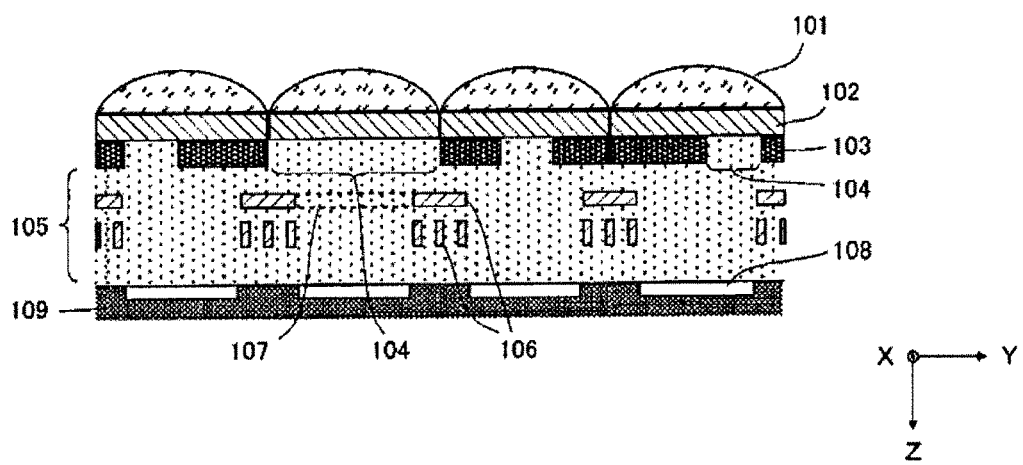
FIG. 2 is a schematic view of a cross section of an image capturing element according to an embodiment of the present invention.

Next, the configuration of the image capturing element 100 is detailed. FIG. 2 is a schematic view of a cross section of an image capturing element according to an embodiment of the present invention. As shown in this drawing, in the image capturing element 100, a micro lens 101, a color filter 102, an opening mask 103, a wiring layer 105, and a photoelectric conversion element 108 are arranged in this order from the side of the subject. The photoelectric conversion element 108 is made up of a photodiode that converts incident light into an electric signal. A plurality of photoelectric conversion elements 108 are arranged two dimensionally on the surface of the substrate 109.

The image signal resulting from conversion by the photoelectric conversion element 108, the control signal for controlling the photoelectric conversion element 108, or the like are transmitted and received via the wiring 106 provided for the wiring layer 105. In addition, the opening mask 103 having openings 104 provided in one-to-one relation to the photoelectric conversion elements 108 contact the wiring layer. As detailed later, the openings 104 are shifted for the corresponding photoelectric conversion elements 108, and their relative positions are strictly determined. The opening mask 103 including this opening 104 operates to generate the parallax to the subject light flux received by the photoelectric conversion element 108 as detailed later.

On the other hand, there is no opening mask 103 provided on the photoelectric conversion elements 108 not desired to generate any parallax. It can also be said that an opening mask 103 having an opening 104 which does not restrict incident subject light flux to the corresponding photoelectric conversion element 108, i.e., which transmits the entire effective light flux, is provided. Or, the wiring 106 can be interpreted as an opening mask that transmits the entire effective light flux that does not cause parallax, since it is practically the wiring 106 that defines the opening 107 through which the incident subject light flux is defined. The opening masks 103 may be arranged independently from each other to correspond to the respective photoelectric conversion elements 108, or alternatively may be formed collectively to the plurality of photoelectric conversion elements 108 just as done to produce the color filters 102.

The color filters 102 are provided on the opening masks 103. The color filters 102 are filters provided in one-to-one relation to the photoelectric conversion elements 108 and are each colored to transmit a specific wavelength region towards the corresponding photoelectric conversion element 108. Two types of color filters different from each other may be provided to output a color image. For outputting a higher quality color image, it is preferable to arrange three or more types of color filters. For example, it is preferable to arrange as a grid formation a red filter transmitting a red wavelength region, a green filter transmitting a green wavelength region, and a blue filter transmitting a blue wavelength region. The specific arrangement is detailed later.

The micro lenses 101 are provided on the color filters 102. The micro lenses 101 are light-collecting lenses for guiding incident subject light flux as much as possible onto the photoelectric conversion elements 108. The micro lenses 101 are provided in one-to-one relation to the photoelectric conversion lenses 108. It is preferable that the optical axes of the micro lenses 101 are shifted so that as much subject light flux as possible can be guided to the photoelectric conversion elements 108, taking into consideration the relative positional relation between the center of the pupil of the image capturing lens 20 and the photoelectric conversion element 108. Moreover, the position of the micro lenses 101 may be adjusted together with the position of the openings 104 of the opening masks 103, so that the specific subject light flux explained later can be received as much as possible.

A unit made of a single opening mask 103, a single color filter 102, and a single micro lens 101 provided in one-to-one relation to a photoelectric conversion element 108 are referred to as "pixel." In particular, a pixel provided with an opening mask 103 causing parallax is referred to as "parallax pixel," and a pixel not provided with any opening mask 103 is referred to as "non-parallax pixel." For example, when an image capturing element 100 has an approximately 24 mm×16 mm effective pixel region, the number of pixels will be about 12 million.

Note that no micro lens 101 would be necessary for an image sensor having favorable light collecting efficiency and photoelectric conversion efficiency. The back side illumination image sensor is provided with the wiring layer 105 at the side opposite to the side at which the photoelectric conversion elements 108 are provided.

Figure 3:
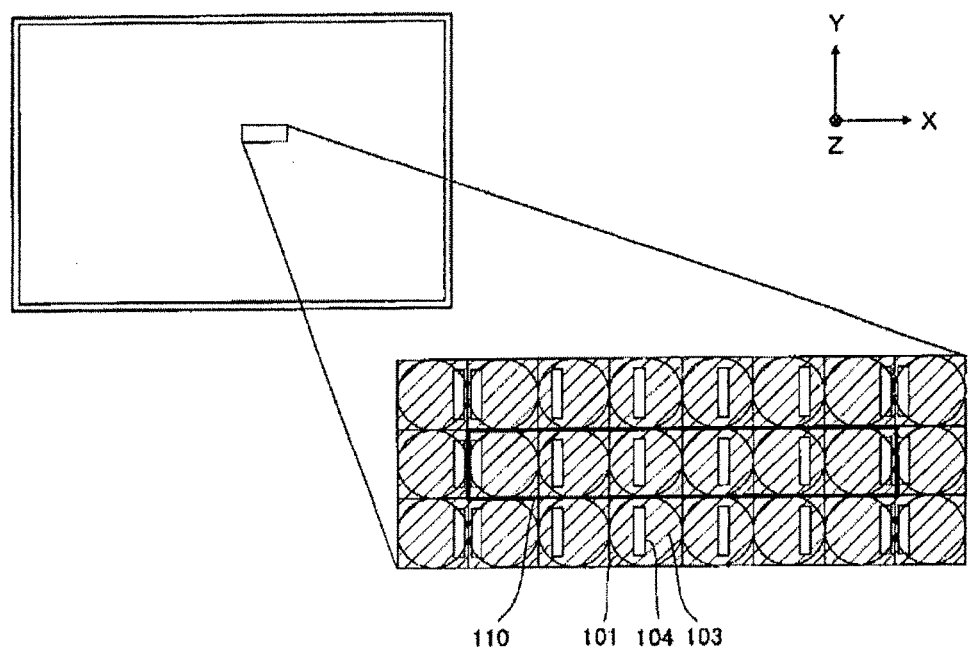
FIG. 3 is a schematic enlarged view of a part of an image capturing element.

The following explains the openings 104 of the opening mask 103 and their relation with the caused parallax. FIG. 3 is a schematic enlarged view of a part of an image capturing element. So as to simplify the explanation for the moment, the colors of the color filters 102 are not considered until later. In the following explanation before the colors of the color filters 102 are taken into consideration, the image sensor can be considered as a collection of parallax pixels all of which have a color filter 102 of the same color. Therefore, the repetitive pattern explained below can be considered as pixels adjacent to each other in the color filter 102 of the same color.

As shown in FIG. 3, the openings 104 of the opening mask 103 are provided to be shifted relative to the corresponding pixels. Moreover, openings 104 respectively of adjacent pixels have been displaced to each other.

In the example shown in this drawing, there are six types of opening masks 103 provided whose openings 104 corresponding to the pixels are shifted from each other in the right and left direction. From the perspective of the entire image capturing element 100, groups of photoelectric conversion elements are arranged two dimensionally as well as periodically, each group of photoelectric conversion element being made up of a set of six parallax pixels within which the opening masks 103 gradually shift from the left to the right in the paper in which the drawing is drawn. The image capturing element 100 can also be expressed such that the repetitive patterns 110 each including a set of photoelectric conversion elements are periodically arranged.

Figure 4:
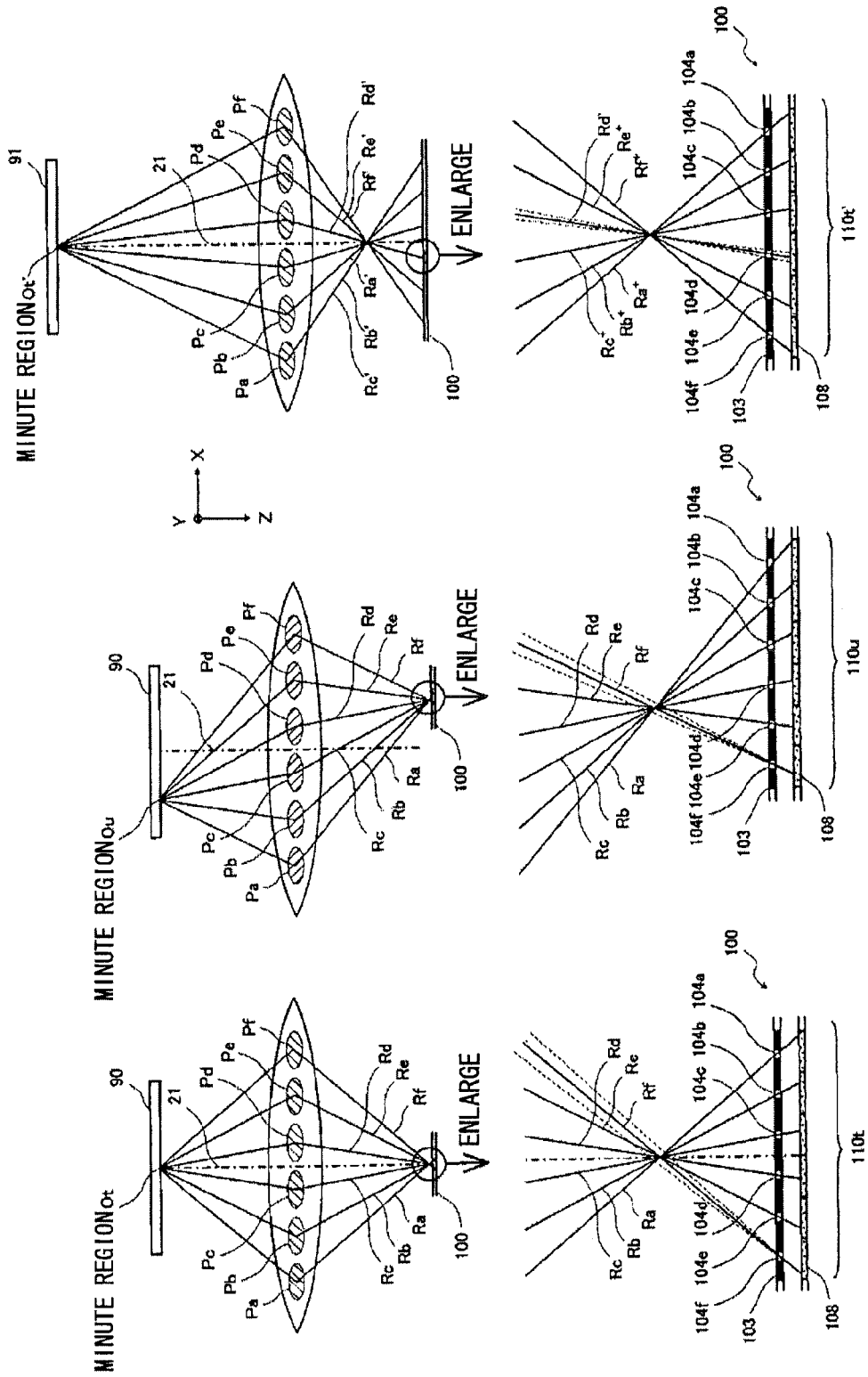
FIG. 4A is a conceptual diagram for explaining the relation between a parallax pixel and a subject.
FIG. 4B is a conceptual diagram for explaining the relation between a parallax pixel and a subject.
FIG. 4C is a conceptual diagram for explaining the relation between a parallax pixel and a subject.

FIG. 4A, FIG. 4B, and FIG. 4C are a conceptual diagram for explaining the relation between a parallax pixel and a subject. FIG. 4A especially represents a group of photoelectric conversion elements of the repetitive pattern 110*t* arranged at the center orthogonal to the image capturing optical axis 21, in the image capturing element 100, and FIG. 4B schematically shows a group of photoelectric conversion elements of a repetitive pattern 110*u* arranged at the peripherals. The subject 90 in FIG. 4A and FIG. 4B exists at the focus position of the image capturing lens 20. FIG. 4C schematically shows the relation in a case in which the subject 91 existing on the non-focus position for the image capturing lens 20 is captured, in contrast to FIG. 4A.

First, the relation between a parallax pixel and a subject when the image capturing lens 20 has captured the subject 90 at the focus state is explained. The subject light flux passes through the pupil of the image capturing lens 20 to be guided towards the image capturing element 100. There are six partial regions Pa-Pf defined for the entire cross section through which the subject light flux passes. As is clear from the enlarged view, the pixels of the group of photoelectric conversion elements constituting the repetitive patterns 110*t* and 110*u* at the leftmost side of the paper are arranged to define the position of the opening 104*f* of the opening mask 103 so that only the subject light flux emitted from the partial region Pf can reach the photoelectric conversion element 108. Likewise, with respect to the rightmost pixels, the position of the opening 104*e* is defined to correspond to the partial region Pe, the position of the opening 104*d* is defined to correspond to the partial region Pd, the position of the opening 104*c* is defined to correspond to the partial region Pc, the position of the opening 104*b* is defined to correspond to the partial region Pb, and the position of the opening 104*a* is defined to correspond to the partial region Pa.

It can also be said that the position of the opening 104*f* is defined by the gradient of the principle light ray Rf emitted from the partial region Pf that is defined by the relative positional relation between the partial region Pf and the leftmost pixel. When the photoelectric conversion element 108 receives the subject light flux from the subject 90 existing on the focused position via the opening 104*f*, the subject light flux forms an image on the photoelectric conversion element 108 as shown by the dotted lines. Likewise, it can be expressed such that with respect to the rightmost pixel, the position of the opening 104*e* is determined by the gradient of the principle light ray Re, the position of the opening 104*d* is determined by the gradient of the principle light ray Rd, the position of the opening 104*c* is determined by the gradient of the principle light ray Rc, the position of the opening 104*b* is determined by the gradient of the principle light ray Rb, and the position of the opening 104*a* is determined by the gradient of the principle light ray Ra.

As shown in FIG. 4A, the light flux of the subject 90 existing on the focused position emitted from the minute region Ot on the subject 90 crossing the optical axis 21 passes the pupil of the image capturing lens 20 to reach each pixel of the group of photoelectric conversion elements constituting the repetitive pattern 110t. In other words, each pixel in the group of photoelectric conversion elements constituting the repetitive pattern 110t receive the light flux emitted from a single minute region Ot via six partial regions Pa-Pf respectively. The minute region Ot has a spread that can accommodate the positional displacement of each pixel of the group of photoelectric conversion elements constituting the repetitive pattern 110t, however can be approximated to substantially one object point. Likewise as shown in FIG. 4B, the light flux of the subject 90 existing on the focused position emitted from the minute region Ou on the subject 90 distanced from the optical axis 21 passes the pupil of the image capturing lens 20 to reach each pixel of the group of photoelectric conversion elements constituting the repetitive pattern 110u. In other words, each pixel in the group of photoelectric conversion elements constituting the repetitive pattern 110u receives the light flux emitted from a single minute region Ou via six partial regions Pa-Pf respectively. Just as the minute pattern Ot, the minute region Ou has a spread that can accommodate the positional displacement of each pixel of the group of photoelectric conversion elements constituting the repetitive pattern 110u, however can be approximated to substantially one object point.

Therefore, as long as the subject 90 exists on the focused position, there are different minute regions caught by the group of photoelectric conversion elements depending on the position of the repetitive pattern 110 on the image capturing element 100, and that each pixel constituting the group of photoelectric conversion elements catches the same minute region via partial regions different from one another. Across the repetitive patterns 110, the pixels corresponding to each other receive the subject light flux from the same partial region. In the example of the drawings, the leftmost pixels of the repetitive pattern 110t and 110u receive the subject light flux from the same partial region Pf.

Note that the position of the opening 104f through which the leftmost pixel receives the subject light flux from the partial region Pf in the repetitive pattern 110t arranged at the center orthogonal to the image capturing optical axis 21 is different, in a strict sense, from the position of the opening 104f through which the leftmost pixel receives the subject light flux from the partial region Pf in the repetitive pattern 110u arranged at the peripherals. However, from the functional point of view, they can be treated as the same type of opening mask in the sense that they both are an opening mask for receiving the subject light flux from the partial region Pf. Therefore, each of the parallax pixels arranged on the image capturing element 100 in the example of FIG. 4A, FIG. 4B, and FIG. 4C can be said to include one of the six types of opening masks.

Next, the relation between the parallax pixel and a subject when the image capturing lens 20 has captured the subject 90 at a non-focus state is explained. In this case too, the subject light flux from the subject 91 existing on the non-focus position pass the six partial regions Pa-Pf of the pupil of the image capturing lens 20, to reach the image capturing element 100. Note that the subject light flux from the subject 91 existing on the non-focused position forms an image at a position different than on the photoelectric conversion element 108. For example as shown in FIG. 4C, when the subject 91 exists farther from the image capturing element 100 than the subject 90, the subject light flux forms an image nearer the subject 91 than the photoelectric conversion element 108. Conversely, when the subject 91 is closer to the image capturing element 100 than the subject 90, the subject light flux forms an image at an opposite side of the photoelectric conversion element 108 with respect to the subject 91.

Therefore, the subject light flux of the subject 91 existing on the non-focus position emitted from the minute region Ot' reaches the corresponding pixel in different sets of repetitive patterns 110 depending on which of the six partial regions Pa-Pf the subject light flux passes. For example, the subject light flux passed through the partial region Pd is incident to the photoelectric conversion element 108 having the opening 104d included in the repetitive pattern 110t' as the principle light ray Rd', as shown in the enlarged view of FIG. 4C. Even among the subject light flux emitted from the minute region Ot', the subject light flux passed the other partial region will not incident on the photoelectric conversion element 108 included in the repetitive pattern 110t', but will be incident to the photoelectric conversion element 108 including the corresponding opening in the other repetitive pattern. In other words, the subject light fluxes reaching respective photoelectric conversion elements 108 constituting the repetitive pattern 110t' are subject light fluxes emitted from different minute regions from each other of the subject 91. In other words, the subject light flux having Rd' as the principle light ray is incident on the 108 corresponding to the opening 104d, whereas to the photoelectric conversion elements 108 corresponding to the other openings, the subject light fluxes having Ra+, Rb+, Rc+, Re+, and Rf+ as the principle light ray are incident. These subject light fluxes are respectively emitted from different minute regions of the subject 91. This relation holds true for the repetitive pattern 110u arranged in the peripheral portion in FIG. 4B.

From the point of view of the entire image capturing element 100, the subject image A caught by the photoelectric conversion element 108 corresponding to the opening 104a does not displace from the subject image D caught by the photoelectric conversion element 108 corresponding to the opening 104d when these subject images correspond to the subjects existing on the focused position, and if the subject images correspond to the subjects existing on the non-focused position, the subject images are displaced with each other. The direction and the amount of the displacement are determined by such factors as how much the subject existing on the non-focused position is displaced in which direction and in what amount from the focused position, and the distance between the partial region Pa and the partial region Pd. In other words, the subject image A and the subject image D are parallax images with respect to each other. This relation holds true for the other openings, and so six parallax images corresponding to the openings 104a-104f are generated.

Therefore, a parallax image is obtained by collecting the output of the pixels corresponding to each other from each repetitive pattern 110 configured in this way. That is, the output of the pixels received the subject light fluxes emitted from each specific partial region from the six partial regions Pa-Pf forms a parallax image.

Figure 5:
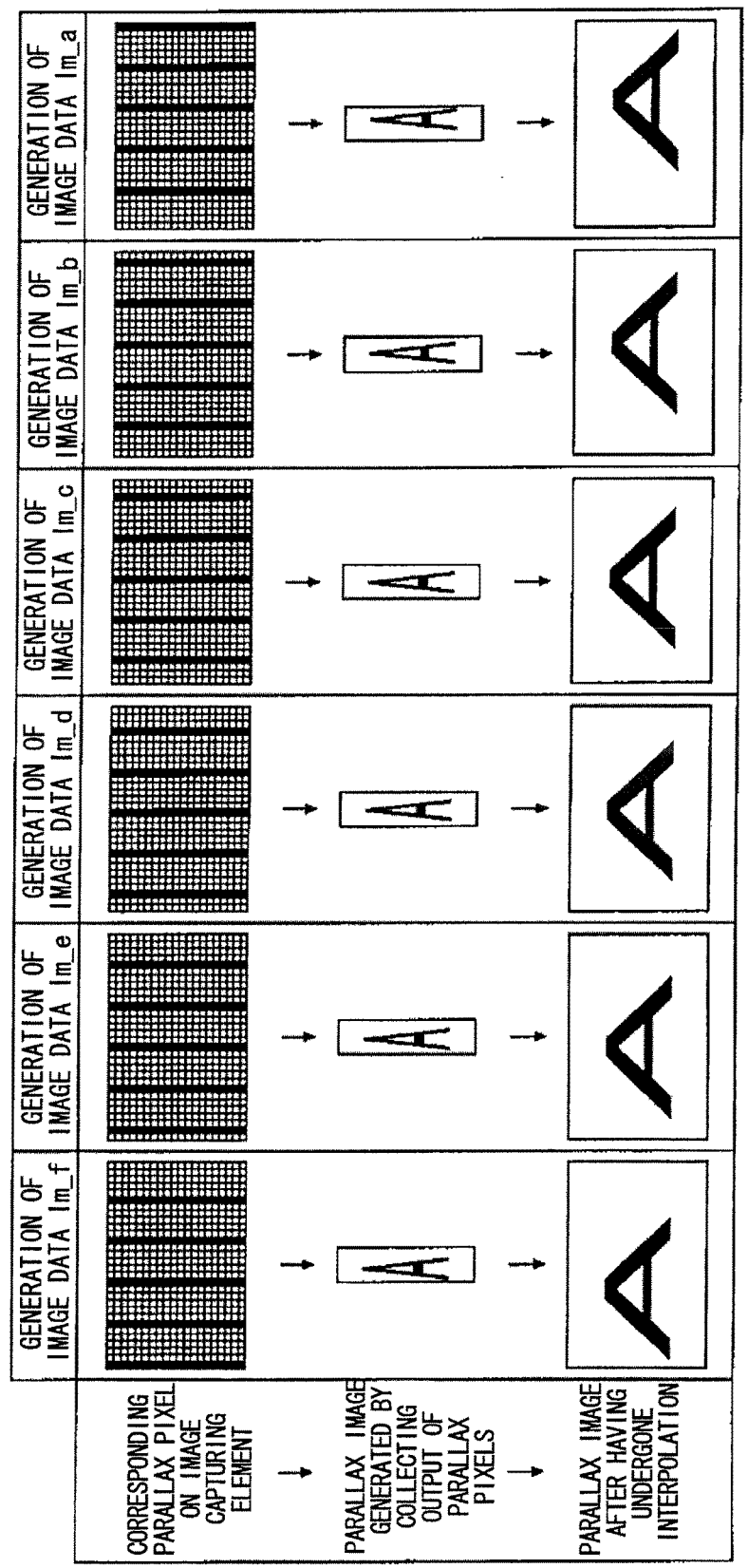
FIG. 5 is a conceptual diagram for explaining a process to generate a parallax image.

FIG. 5 is a conceptual diagram for explaining a process to generate a parallax image. The drawing shows, from the left, generation of the parallax image data Im_f generated by collecting the output of the parallax pixels corresponding to the opening 104f, generation of the parallax image data Im_e generated by collecting the output of the parallax pixels corresponding to the opening 104e, generation of the parallax image data Im_d generated by collecting the output of the parallax pixels corresponding to the opening 104d, generation of the parallax image data Im_c generated by collecting the output of the parallax pixels corresponding to the opening 104c, generation of the parallax image data Im_b generated by collecting the output of the parallax pixels corresponding to the opening 104b, and generation of the parallax image data Im_a generated by collecting the output of the parallax pixels corresponding to the opening 104a. First, the generation of the parallax image data Im_f generated by the output from the opening 104f is explained.

The repetitive patterns 110 each made up of a photoelectric conversion element group made of a set of six parallax pixels are arranged as an array in the lateral direction. The parallax pixels having the opening 104f are positioned on the image capturing element 100 in every six pixels in the lateral direction and to be consecutive in the longitudinal direction. These pixels receive the subject light flux from minute regions different from each other as stated above. A parallax image can be obtained by arranging the collection of the output of these parallax pixels.

However, each pixel of the image capturing element 100 according to the present embodiment is a square pixel. Therefore, by simply collecting them, the number of pixels in the lateral direction will be thinned out to ⅙, resulting in image data that is long in the longitudinal direction. By applying interpolation processing to generate six times the number of pixels in the lateral direction, the parallax image data Im_f is generated as an image having the original aspect ratio. However, since the parallax image data before subjected to interpolation is the image thinned out to ⅙ in the lateral direction, the resolution of the resulting image in the lateral direction is lower than the resolution in the longitudinal direction. This suggests the incompatibility between the number of parallax image data generated and the improvement of resolution.

As a result of similar processing, the parallax image data Im_e—the parallax image data Im_a are obtained. That is, the digital camera 10 can generate six parallax images from six different view points having parallaxes in the lateral direction.

Figure 6A:
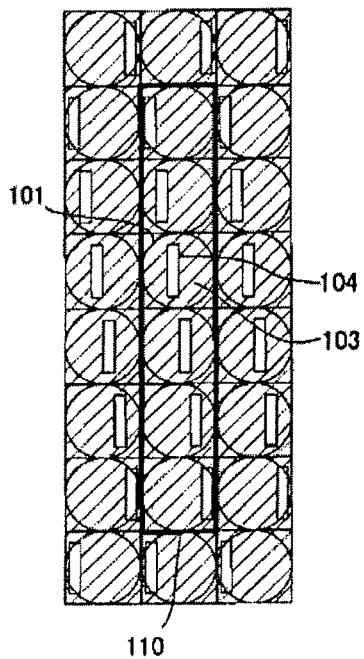
FIG. 6A shows another example of a repetitive pattern.
Figure 6B:
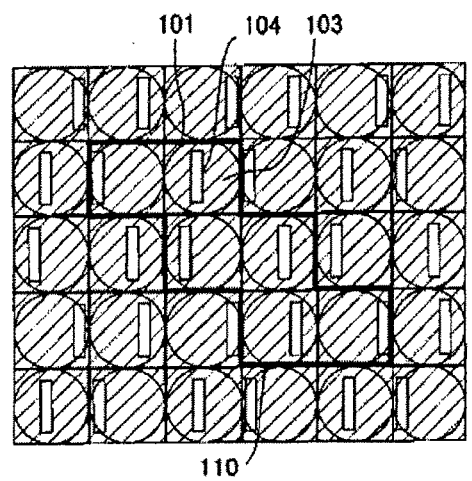
FIG. 6B shows another example of a repetitive pattern.

In the above example, the repetitive pattern 110 was explained as an array in the lateral direction. However, the repetitive pattern 110 is not limited to this example. FIGS. 6A and 6B show different examples of the repetitive pattern 110.

FIG. 6A is an example in which six pixels arranged in the longitudinal direction are selected as a repetitive pattern 110. It may be noticed that the openings 104 of the parallax pixels gradually shift from the left to the right of the paper in which the drawing is drawn starting from the parallax pixel on top of the paper. The repetitive pattern 110 in such an arrangement can also be used to generate parallax images having six view points giving parallax in the lateral direction. This repetitive pattern can be said as a repetitive pattern that can maintain the resolution in the lateral direction at the cost of resolution in the longitudinal direction.

FIG. 6B is an example in which six pixels adjacent in an oblique direction are used as a repetitive pattern 110. It may be noticed that the openings 104 of the parallax pixels gradually shift from the left to the right of the paper in which the drawing is drawn starting from the leftmost top parallax pixel in the paper in which the drawing is drawn towards the lower right direction. The repetitive pattern 110 in such an arrangement can also be used to generate parallax images having six view points giving parallax in the lateral direction. Comparing with the repetitive pattern 110 of FIG. 3, this repetitive pattern can be said as a repetitive pattern that can maintain the resolutions in both the lateral and longitudinal directions to some extent while increasing the number of parallax images.

Comparing the repetitive pattern 110 of FIG. 3 with the repetitive patterns 110 respectively of FIG. 6A and FIG. 6B, their difference boils down to whether they sacrifice the resolution in the longitudinal direction or the lateral direction compared to the resolution of a single image made from the entire image when attempting to generate parallax images from six view points. The repetitive pattern 110 of FIG. 3 makes the resolution in the lateral direction to ⅙. The repetitive pattern 110 of FIG. 6A makes the resolution in the longitudinal direction to ⅙. The repetitive pattern 110 of FIG. 6B cuts the resolution to ⅓ in the longitudinal direction and to ½ in the lateral direction. In either case, one pattern includes openings 104a-104f that each are corresponded with a pixel. Each of the openings 104a-104f is to receive the subject light flux from the corresponding one of the partial regions Pa-Pf. Therefore, each repetitive pattern 110 has the same amount of disparity.

Figure 7:
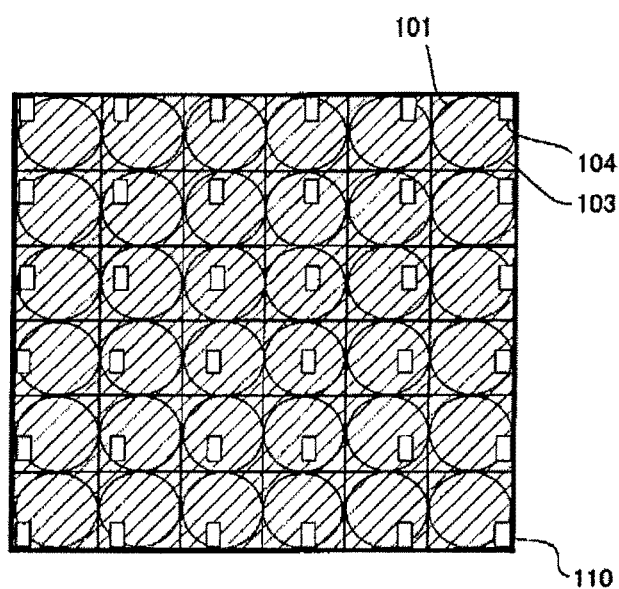
FIG. 7 shows an example of a two-dimensional repetitive pattern.

The above examples are directed to generation of a parallax image for giving parallax in the lateral direction. However, it is possible to generate a parallax image for giving parallax in the longitudinal direction and two dimensionally in both of the longitudinal and lateral directions. FIG. 7 shows an example of a two-dimensional repetitive pattern 110.

The example of FIG. 7 shows a repetitive pattern 110 that has 36 pixels (six pixels in the lateral direction and six pixels in the longitudinal direction) as a set of photoelectric conversion elements. In addition, 36 types of opening masks 103 are prepared to shift the openings 104 for the pixels in the lateral and longitudinal directions. Specifically, the openings 104 are arranged so that they gradually shift from top to down from the uppermost pixel to the lowermost pixel of the repetitive pattern 110, as well as gradually shifting from the left to the right from the leftmost pixel to the rightmost pixel.

The image capturing element 100 having this repetitive pattern 110 can output parallax images of 36 view points that can give parallax in both of the longitudinal direction and the lateral direction. It is needless to say that the repetitive pattern 110 is not limited to the example shown in FIG. 7, and can be determined arbitrarily so as to output parallax images of a different number of view points.

The example stated above adopts rectangular openings 104. In the arrangement that gives parallax in the lateral direction in particular, the amount of light can be secured for the photoelectric conversion element 108 by making the width in the longitudinal direction not shifted to be wider than the width in the lateral direction to be shifted. However, the shape of the openings 104 is not limited to rectangular.

Figure 8:
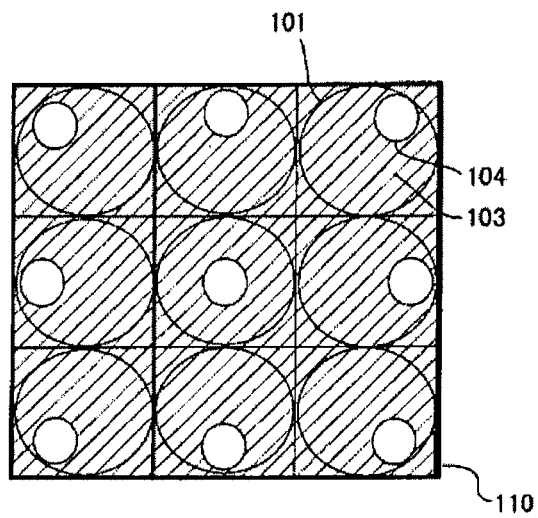
FIG. 8 explains another shape of an opening.

FIG. 8 explains another shape of an opening. In this drawing, the shape of the opening 104 is defined as round. A round opening 104 can prevent unintended subject light flux from being incident on the photoelectric conversion element 108 as stray light, thanks to the similarity to the hemispherical shape of the micro lens 101.

Figure 9:
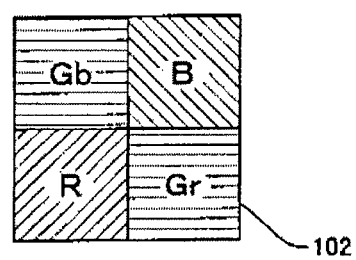
FIG. 9 explains a Bayer array.

The following is an explanation on the color filter 102 and the parallax image. FIG. 9 explains a Bayer array. As shown in this drawing, in the Bayer array, the upper left pixel and the lower right pixel are green filters, the lower left pixel is a red filter, and the upper right pixel is a blue filter. In this specification, the upper left pixel assigned a green filter is referred to as a Gb filter, and the lower right pixel assigned another green filter is referred to as a Gr pixel. In addition, the pixel assigned a red filter is referred to as a R pixel, and the pixel assigned a blue filter is referred to as a B pixel. The lateral direction along which the Gb pixel and the B pixel are aligned is referred to as a Gb row, and the lateral direction along which the R pixel and the Gr pixel are aligned is referred to as a Gr row. The longitudinal direction along which the Gb pixel and the R pixel are aligned is referred to as a Gb column, and the longitudinal direction along with the B pixel and the Gr pixel are aligned is referred to as a Gr column.

An enormous number of repetitive patterns 110 can be configured for a particular array of color filters 102 by determining which parallax pixel and non-parallax pixel are to be assigned and in which periodicity and for which colored pixel. By collecting the output of the non-parallax pixels, the captured image data can be without parallax just as a normal captured image. By increasing the ratio of the non-parallax images, a 2D image having a high resolution can be outputted. However, this repetitive pattern may not be suited for a 3D image composed of a plurality of parallax images because it is expected that the image quality will degrade because of a relatively small ratio of parallax pixels. Conversely, by increasing the ratio of parallax pixels, a 3D image will have increased image quality, while in the case of a 2D image, the resolution thereof will be low.

In the trade-off relation stated above, various repetitive patterns 110 having various features can be set by determining the positioning of the parallax pixels and the non-parallax pixels. FIG. 10 explains various examples in which parallax pixels are allocated to a Bayer array when there are two kinds of parallax pixels. The examples assume the parallax L pixel whose opening 104 is decentered towards left from the center, and the parallax R pixel whose opening 104 is decentered towards right from the center. That is, the two view point parallax images outputted from the parallax images realize a so-called stereoscopic vision.

Please refer to the drawing for the explanation of the features of the repetitive patterns. For example, if many non-parallax pixels are assigned, it will make 2D image data of a high resolution. If non-parallax pixels are assigned uniformly across the RBG pixels, it will make 2D image data having a high image quality without less color shift. When 2D image data is generated by also using the output of the parallax pixels, the displaced subject image is corrected by referring to the output of the peripheral pixels. Therefore, a 2D image can still be generated even when all the R pixels are parallax pixels, however with compromised image quality.

On the other hand, when many parallax pixels are assigned, it will make 3D image data of a high resolution. If parallax pixels are assigned uniformly across the RBG pixels, the 3D image will have favorable color reproduction and high quality for a 3D image. If 3D image data is generated by also using the output of non-parallax pixels, the resulting subject image is displaced by referring to the output of the parallax pixels on the peripherals from the subject image with no parallax. Therefore, when all the R pixels are non-parallax pixels, a 3D color image can still be generated, however with reduced quality.

The following explains some variations. FIG. 11 shows an example of a different variation. The variation shown in FIG. 11 corresponds the classification A-1 of the repetitive patterns of FIG. 10.

In the example of the drawing, the same four pixels used in the Bayer array are used as the repetitive pattern 110. The R pixel and the B pixel are non-parallax pixels, and the Gb pixel is assigned to the parallax L pixel and the Gr pixel to the parallax R pixel. In this case, the openings 104 are determined so that the parallax L pixel and the parallax R pixel contained in the same repetitive pattern 110 can receive the subject light flux passing through different partial regions on the pupil.

In the example of the drawing, the Gb pixel and the Gr pixel are both green pixels having high luminosity, and so a parallax image having high contrast is expected to be obtained. In addition, both of the Gb pixel and the Gr pixel used are green pixels, and so the two outputs can be easily converted to an output without parallax. Therefore, 2D image data having high image quality can be generated together with the output of the R pixel and the B pixel that are non-parallax pixels.

Figure 12:
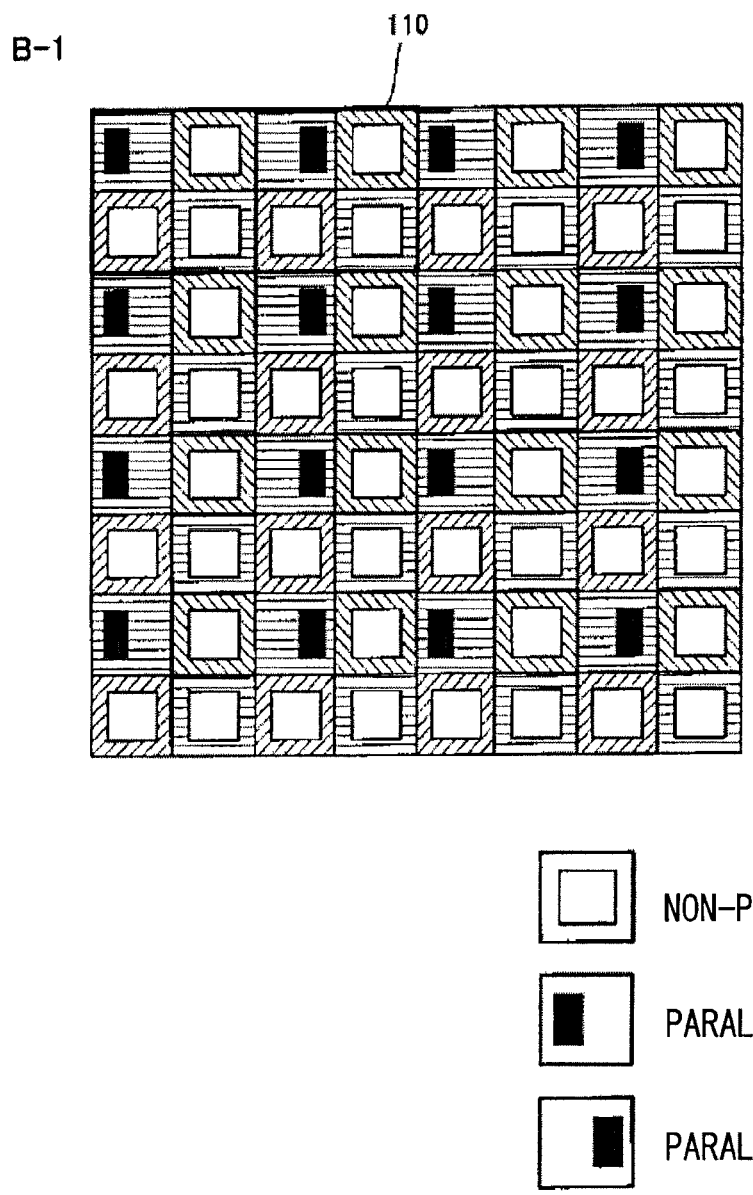
FIG. 12 shows an example of a different variation.

FIG. 12 shows an example of a different variation. The variation shown in FIG. 12 corresponds the classification B-1 of the repetitive patterns of FIG. 10.

In the example of the drawing, eight pixels having two sets of four pixels of the Bayer array arranged in the lateral direction are used as the repetitive pattern 110. Out of these eight pixels, the left Gb pixel is assigned the parallax L pixel, and the right Gb pixel is assigned the parallax R pixel. In this arrangement, the Gr pixel is set to be the non-parallax pixel, and so further enhanced image quality can be expected from the 2D image compared to the example of FIG. 10.

FIG. 13 shows an example of a different variation. The variation shown in FIG. 13 corresponds to the classification D-1 of the repetitive patterns of FIG. 10.

In the example of the drawing, eight pixels having two sets of four pixels of the Bayer array arranged in the lateral direction are used as the repetitive pattern 110. Out of these eight pixels, the left Gb pixel is assigned the parallax L pixel, and the right Gb pixel is assigned the parallax R pixel. Further, the left R pixel is assigned the parallax L pixel, and the right R pixel is assigned the parallax R pixel. Further, the left B pixel is assigned the parallax L pixel, and the right B pixel is assigned the parallax R pixel. The two Gr pixels are assigned non-parallax pixels.

The parallax L pixel and the parallax R pixel assigned to the two Gb pixels receive the light flux emitted from a single minute region, when capturing a subject existing on the focus plane. Both of the parallax L pixel and the parallax R pixel assigned to the two R pixels receive the light flux emitted from a single minute region different from that of the Gb pixel, and both of the parallax L pixel and the parallax R pixel assigned to the two B pixels receive the light flux emitted from a single minute region different from those of the Gb pixel and the R pixel. This helps increase the resolution of a 3D image. Besides, three color output corresponding to RGB can be obtained, which realizes high quality 3D color image.

Note that when two kinds of parallax pixels are provided as explained above, it will produce parallax images of two view points. However, various numbers of types of parallax pixels can be adopted as explained with reference to FIG. 3, FIG. 7, and FIG. 8, or the like, according to the number of parallax images desired to be outputted. Various repetitive patterns 110 can be formed even when the number of view points is increased. Thus, the repetitive pattern 110 that suites to the particular specification, purpose, or the like can be selected.

The above-stated example adopts the Bayer array as a color filter array. However, other color filter arrangement can also be adopted. When a single color constituting a color filter array is taken into consideration as explained with reference to FIG. 3 or the like, the parallax pixels may be assigned so as to form the repetitive pattern that includes a plurality of pixels adjacent to each other as a set of photoelectric conversion elements, and output a parallax image. Each of the parallax pixels constituting a set of photoelectric conversion elements may preferably include an opening mask 103 having openings 104 facing different partial regions from each other.

Therefore, the image capturing element 100 may include photoelectric conversion elements 108 arranged two dimensionally and photoelectric converting incident light into an electric signal, opening masks 103 provided in a one-to-one relation with at least a part of the photoelectric conversion elements 108, and color filters 102 provided in a one-to-one relation with at least a part of the photoelectric conversion elements 108, where the openings 104 of the opening masks 103 provided to correspond to at least three out of the n photoelectric conversion elements 108 adjacent to each other (n being an integer equal to or larger than 3) are included in a single pattern of the color filter patterns made of at least two types of color filters 102 transmitting respectively different wavelength regions, and transmit the light flux from partial regions different from each other in the sectional region of the incident light, and a group of photoelectric conversion elements made of a set of n photoelectric conversion elements 108 may be periodically arranged.

Figure 14:
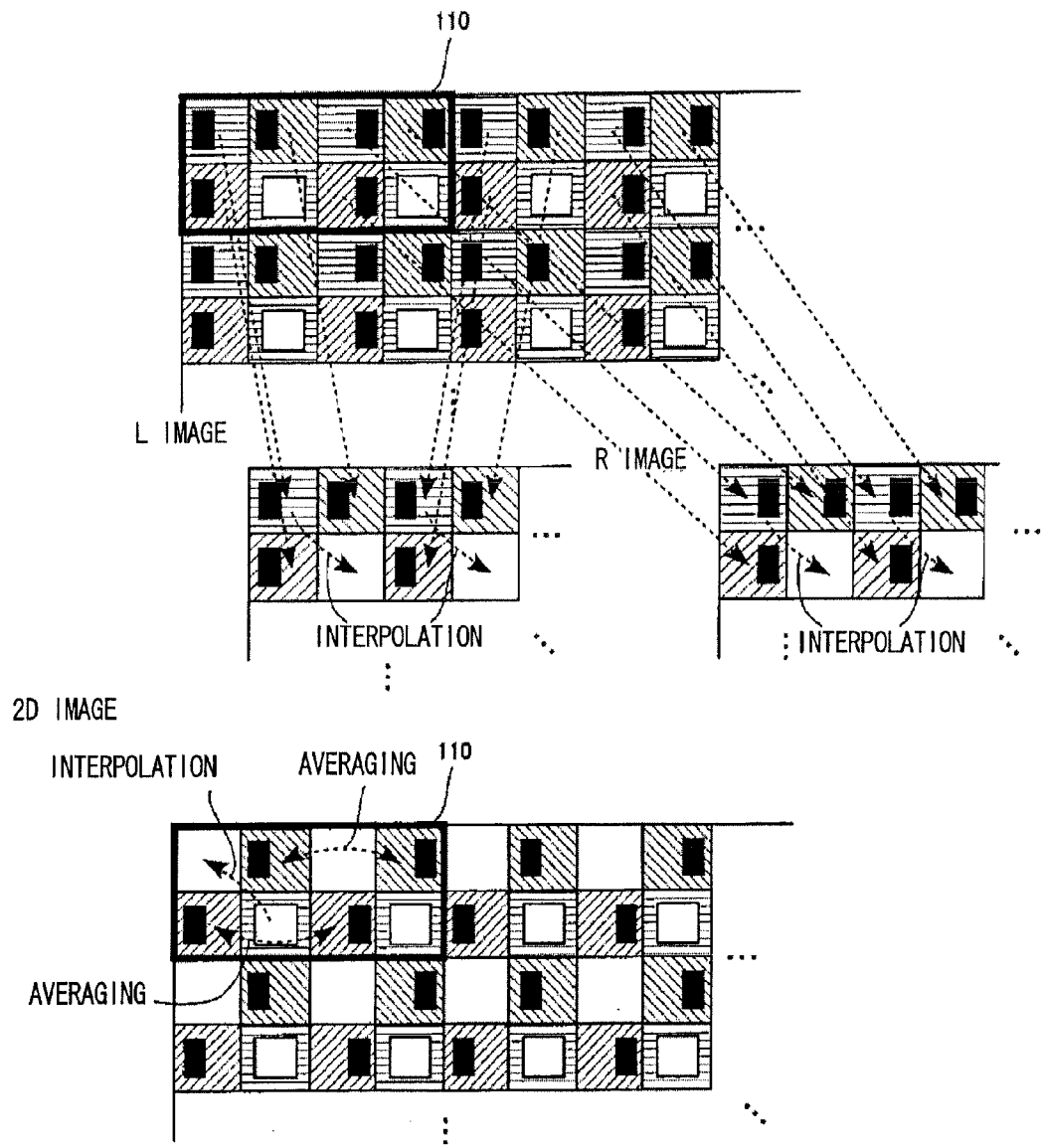
FIG. 14 is a conceptual diagram showing a generating process of a parallax image and a 2D image.

The following explains generation of a parallax image as a color image and generation of a 2D image as a color image. FIG. 14 is a conceptual diagram showing a generating process of a parallax image and a 2D image. Here, the repetitive pattern classification $D_1$ explained above with reference to FIG. 13 is used as an example. As shown in FIG. 14, the output of the parallax L pixels is collected while keeping the relative positional relation of them on the image capturing device 100, thereby generating L image data. The parallax L pixels included in a single repetitive pattern 110 are a left Gb pixel, an R pixel, and a B pixel, from among the eight pixels which are two sets of the four pixels of the Bayer pixel arranged in the lateral direction. Here, the output of the Gb pixel is interpolated on the position of the left Gr pixel which is a non-parallax pixel.

The image signals corresponding to the Bayer array are arranged in the L image data generated in this way. Therefore, L image data can be generated as a color image, by performing the image processing to the output of the Bayer array. For example, a JPEG file can be generated as a visible image format. Please note that the L image data is made by collecting the image signals corresponding to the positions of the four left signals of a single repetitive pattern 110, and so the image signals corresponding to the four right pixels are missing. Therefore, the generated image is compressed in the lateral direction compared to the actual subject image. Thus, interpolation is performed to the L image data to adjust the aspect ratio in either stage as explained above with reference to FIG. 5.

Likewise, the output of the parallax R pixels is collected while keeping the relative positional relation of them on the image capturing device 100, thereby generating R image data. Please note that the R image data is made by collecting the image signals corresponding to the positions of the four right signals of a single repetitive pattern 110, and so the image signals corresponding to the four left pixels are missing. Thus, interpolation is also performed to the R image data to adjust the aspect ratio in either stage as explained above with reference to FIG. 5, just as in the case of the L image data.

The output of the non-parallax L pixels is collected while keeping the relative positional relation of them on the image capturing device 100, thereby generating 2D image data. In the example shown in the drawing, only the two Gr pixels in a single repetitive pattern 110 are non-parallax pixels. Thus, the non-parallax pixels corresponding to the other pixel positions are generated by interpolation and averaging processing. Specifically, the output of a Gb pixel is interpolated by the output of the adjacent Gr pixel. In addition, because the R pixels included in the repetitive pattern 110 are respectively a parallax L pixel and a parallax R pixel, the output of the two R pixels is averaged to consider the result as a non-parallax output. Likewise, because the B pixels included in the repetitive pattern 110 are respectively a parallax L pixel and a parallax R pixel, the output of the two B pixels is averaged to consider the result as a non-parallax output. By performing the interpolation and averaging processing in this manner, 2D image data can be generated by performing image processing to the output of the Bayer array.

Note that the above-stated image processing is executed by the image processing section 205. The image processing section 205 receives an image signal outputted from the image capturing element 100 via the control section 201, allocates it according to each pixel output, and generates L image data, R image data, and 2D image data.

Figure 15:
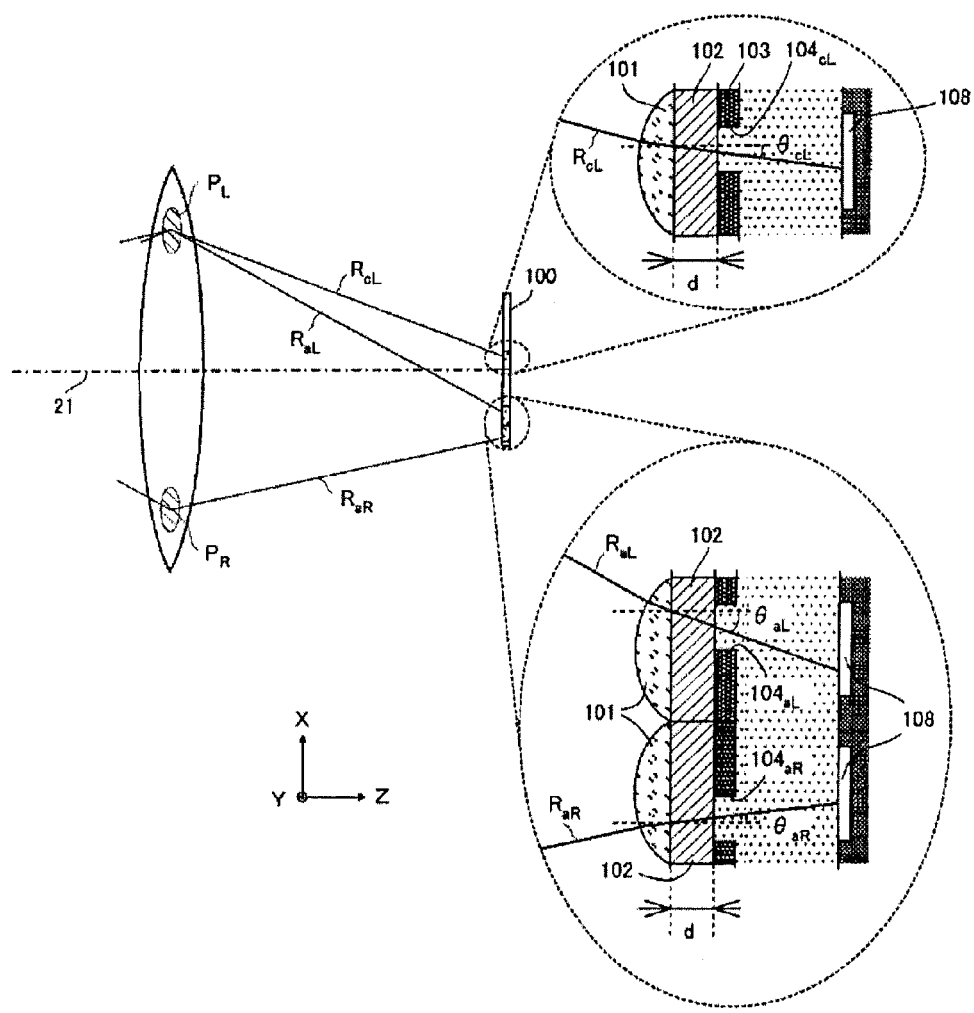
FIG. 15 explains the difference in incident angle of a principle light ray with respect to a color filter.

The following explains the color imbalance caused between the parallax images and how to cope with this problem. FIG. 15 explains the difference in incident angle of a principle light ray with respect to a color filter. As explained above, the position of the opening 104 of the parallax pixel is determined so that it will be oriented to a particular partial region set to the pupil.

For example, when two parallax pixels that are outside the optical axis 21 but have substantially the same image height are taken as an example, for the parallax R pixel, the position of the opening $104_{aR}$ is determined to face the partial region $P_R$, and for the other parallax L pixel, the position of the opening $104_{aL}$ is determined to face the partial region $P_L$. Here, the incident angle of the principle light ray $R_{aR}$ of the subject light flux that goes from the partial region $P_R$ to the parallax R pixel with respect to the color filter 102 is $\theta_{aR}$. The incident angle of the principle light ray $R_{aL}$ of the subject light flux that goes from the partial region $P_L$ to the parallax L pixel with respect to the color filter 102 is $\theta_{aL}$.

When the thickness of the color filter 102 is d, the optical length of the principle light ray $R_{aR}$ passing through the color filter 102 is d/cos $\theta_{aR}$. The optical length of the principle light ray $R_{aL}$ passing through the color filter 102 is d/cos $\theta_{aL}$. This shows that, although corresponding to each other, the parallax R pixel and the parallax L pixel have different optical lengths with respect to the color filter 102. When the optical length to the color filter 102 is different, the amount of light that reaches the photoelectric conversion element 108 will be different. This means that the parallax R pixel and the parallax L pixel will have different output values although catching the light flux emitted from the same minute region of the subject. Hence, the parallax R pixel and the parallax L pixel will output different color signal from each other. In this specification, the optical length is defined as the physical length of the light passing the color filter 102.

Figure 16:
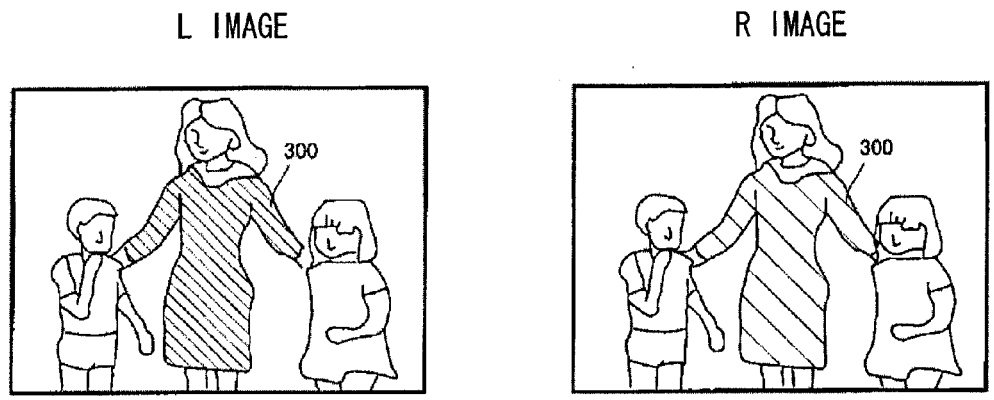
FIG. 16 shows a concept of distorted color balance between parallax images.

FIG. 16 shows a concept of distorted color balance between parallax images. When the parallax R pixel and the parallax L pixel output different signals from each other although capturing the light flux emitted from the same minute region of the subject, the color of a subject (e.g., cloth) will be different between the R image and the L image. Observers would feel it unpleasant to look at the stereoscopic image realized using these two images.

In addition, there may occasionally be color imbalance caused in each plane of the R image and the L image. Now, returning to FIG. 15, please refer to the parallax L pixel near the optical axis and the parallax L pixel having a certain image height with respect to the optical axis explained above. Also for the parallax L pixel near the optical axis, the position of the opening $104_{cL}$ facing the partial region $P_L$ is determined. However, the incident angle of the principle light ray $R_{cL}$, that goes from the partial region $P_L$ to the parallax L pixel near the optical axis is $\theta_{cL}$. On the other hand, as mentioned above, the incident angle of the principle light ray $R_{aL}$ that goes from the partial region $P_L$ to the parallax L pixel having a certain image height is $\theta_{aL}$.

When the color filters 102 have the same thickness d, the optical length of the principle light ray $R_{cL}$ when passing through the color filter 102 is $d/\cos \theta_{cL}$, and the optical length of the principle light ray $R_{aL}$ when passing through the color filter 102 is $d/\cos \theta_{aL}$. This means that the optical length to the color filter 102 is different between the parallax L pixel near the optical axis and the parallax L pixel having the image height. If such is the case, even when the caught subject has the same color, the parallax L pixels emit different color signals from each other. In the example of FIG. 16, even though the color is the same across the entire cloth 300 in the L image, the color will change as gradation from around the center of the L image to the peripheral region. This relation holds true for the parallax R pixel, which causes the color unevenness in the R image that corresponds to the L image. In addition, the result will be different between the L image and the R image.

In other words, in the pixel structure of the image capturing element 100, the color imbalance will result attributed to the position of the photoelectric conversion element 108 on the light receiving surface of the image capturing element 100 and the displacement of the opening 104 in the opening mask 103. This color imbalance is corrected in the present embodiment.

Figure 17:
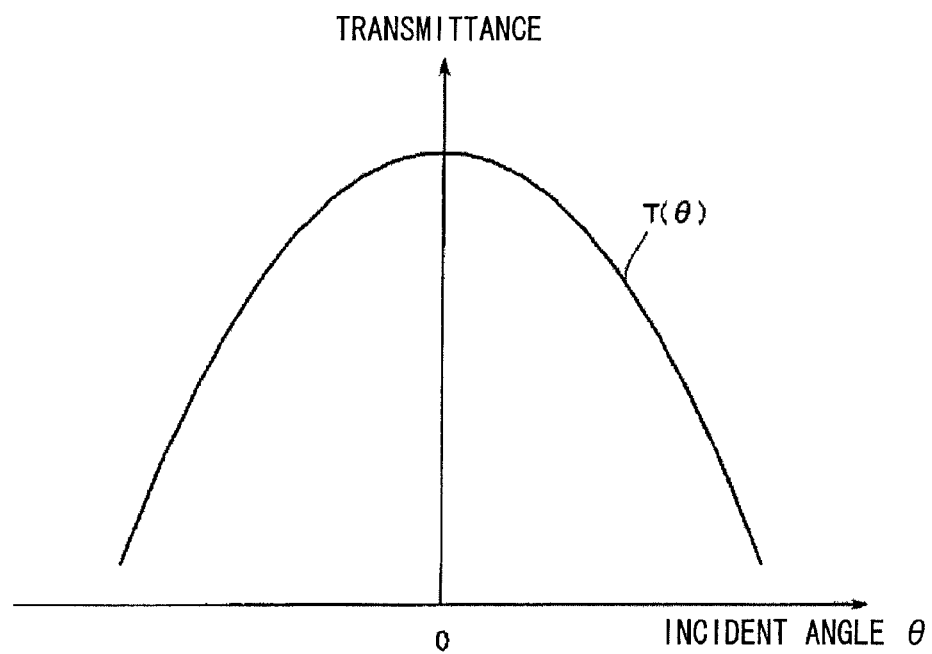
FIG. 17 shows a relation between the incident angle to a color filter and the transmittance.

FIG. 17 shows a relation between the incident angle to the color filter 102 and the transmittance. The lateral axis expresses the incident angle θ of the principle light ray with respect to the color filter 102, and the longitudinal axis expresses the transmittance that is the ratio in amount of light between before incidence and after emission. As shown in this drawing, the transmission T(θ) is represented by a curve that has the maximum value at θ=0. Specifically, the absorbing coefficient of the color filter 102 is denoted as a, and the thickness as d, $T(\theta)=e^{(-\alpha \times d/\cos \theta)}$.

In the present embodiment, the pixel output by the subject light flux whose principle light ray is incident at the incident angle of θ is converted to the pixel output when it is incident at the incident angle of 0, for correction. Specifically, when the actually detected pixel output is I(θ), the correction operation for yielding $I_c(\theta)=\{T(0)/T(\theta)\} \times I(\theta)$ is executed by the image processing section 205 to each pixel.

The position of the opening 104 of each parallax pixel is determined to face its corresponding partial region. Therefore, for each parallax pixel, the incident angle of the principle light ray to the color filter 102 is known. The incident angle of the principle light ray for each parallax pixel is stored in advance in the system memory included in the control section 201.

By performing the above-mentioned correction processing, the color imbalance attributed to the position of the photoelectric conversion element 108 on the light receiving surface of the image capturing element 100 and the color imbalance attributed to the displacement of the opening 104 can be corrected. Consequently, the digital camera 10 can output color parallax image data having a high quality level.

In the above-explained correction processing, the pixel output was converted to the pixel output when it is incident at the incident angle of 0. However, the reference of correction can be selected arbitrarily according to the purpose of processing. For example, if the purpose of the correction to alleviate the color imbalance attributed to different signals outputted from the parallax R pixel and the parallax L pixel though catching the light flux emitted from the same minute region of the subject, an incident angle can be corrected with reference to the other incident angle. In other words, when only the color imbalance attributed to the displacement of the opening 104 should be corrected, there is no correction operation necessary for the reference parallax pixel, and so the amount of operation will be halved, and the improvement in processing speed is expected to be realized.

In the above explanation, a certain reference lens unit 50 is mounted to the main-body unit 30. In such a configuration, the position of the pupil of the image capturing lens 20 is fixed, and the partial region that each opening 104 faces against is a fixed region. Under the assumption of the existence of such a reference lens unit 50 thereon, the opening mask 103 of the image capturing element 100 is provided with an opening 104 corresponding to the respective photoelectric conversion element 108.

Therefore, if another lens unit 50 different from the reference lens unit 50 is mounted to the main body unit 30, the position of the pupil may differ from the position of the pupil of the reference lens unit 50. There are some lens units 50 whose position of the pupil substantially matches the position of the pupil of the reference lens unit 50 under a certain condition may change their pupil position when the configuring lens such as a focus lens, a zoom lens, or the like has moved.

Figure 18:
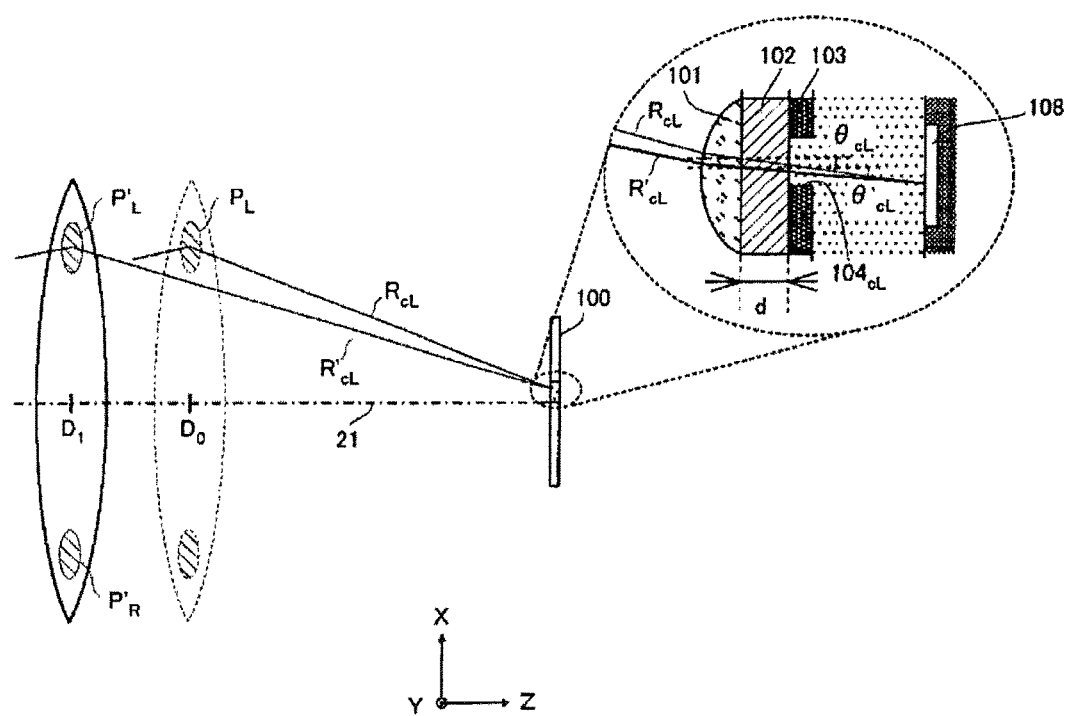
FIG. 18 explains the difference in incident angle of a principle light ray when a lens unit having a different pupil position is mounted.

In this way, when there is a pupil existing on a position different from the reference pupil position, the amount of change of the pupil position can be taken into consideration in the above-explained correction processing. FIG. 18 explains the difference in incident angle of a principle light ray when a lens unit 50 having a pupil position different from the reference position is mounted. Although the pupil position of the reference lens unit 50 is at the distance $D_0$ away from the light receiving surface of the image capturing element 100, the lens unit 50 whose pupil position is positioned at the distance $D_1$ is assumed in the drawing. The drawing includes an enlarged view of the parallax L pixel near the pixel axis that was specifically drawn in FIG. 15.

For the parallax L pixel near the optical axis, the position of the opening $104_{cL}$ is determined to face against the partial region $P_L$. However, when the lens unit 50 whose pupil position is at the distance $D_1$, the parallax L pixel mainly receives the light flux of the principle light ray $R'_{cL}$ emitted from the partial region $P'_L$ in this pupil. Therefore, the principle light ray $R'_{cL}$ is incident on the color filter 102 at an angle different from that of the principle light ray $R_{cL}$ from the partial region $P_L$. This incident angle is represented as $\theta'cL$, as also shown in the drawing.

Here, the pupil position $D_0$ of the reference lens unit 50 is known, and the incident angle $\theta_{cL}$ is represented as a function of $D_0$. Therefore, if the pupil position $D_1$ of the mounted lens unit 50 can be detected, the incident angle $\theta'_{cL}$ can be calculated by using this function. When the incident angle $\theta'_{cL}$ is calculated, you can make conversion to obtain the pixel output when the light is incident with the incident angle of 0.

The control section 201 determines the distance $D_1$, which is the pupil position of the mounted lens unit 50, using the lens information received from the lens control section 231. For example, when the pupil position of the lens unit 50 is fixed regardless of the movement of the lens such as a focus lens, the control section 201 receives the pupil position stored in the lens memory 232 as lens information, and determines the pupil position at the distance $D_1$. In addition, the control section 201 determines the distance $D_1$ by calculating the displacement of the focus lens position when it has obtained focus information at the time of obtaining the parallax image data.

As explained above, the color imbalance can be corrected even in a case when the pupil position of the mounted lens unit 50 is displaced from the reference pupil position. Note that the stated example deals with the parallax L pixel near the optical axis. However, the difference of the incident angles of the principle light rays can also be absorbed even when a parallax L pixel has an image height. It is also needless to say that the difference in incident angle of the principle light rays is the same in the case of the parallax R pixel as in the above-explained case for the parallax L pixel. Therefore, the similar correction processing can be also used to the R image data.

There may be other parameters that can affect the color imbalance. For example, there may be wavelength dependency in attenuation at the transmission between the light flux transmitting near the optical axis of the pupil and the light flux transmitting the peripheral portion attributed to the character of the lens glass material. In the present embodiment, the parallax pixels are set to receive the light flux transmitting through a particular partial region. Such wavelength dependency may be a cause of the color imbalance. In such a case, the transmittance information for each wavelength with respect to the diameter direction in the pupil of the image capturing lens 20 may be obtained by experiments and simulation and stored in the lens memory 232 as a lookup table. The control section 201 can obtain the lookup table from the lens control section 231 as lens information, and use it in the correction processing.

In addition, the control section 201 can also obtain diaphragm information at the time of obtaining the parallax image data, as lens information, and use the diaphragm information in the correction processing. In the present embodiment, the parallax pixel is set to receive the light flux passing through the particular partial region, and so a particular partial region may be blocked by the diaphragm depending on which diaphragm value is set. Therefore, the information processing section 205 takes into consideration the region for which the light is blocked due to the diaphragm, according to the diaphragm information received from the control section 201, thereby calculating the incident angle of the principle light ray changed with respect to the color filter 102. The correction processing can be pursued as stated above once the incident angle of the changed principle light ray has been calculated.

In the above explanation, the correction processing is executed between the different pieces of parallax image data. However, since the 2D image data that has caught the same subject is also generated due to the image signal outputted from the image capturing element 100, the 2D image data can also be referred to in the correction processing. For example, when the output of a particular pixel is different from the output of the peripheral pixels by an amount equal to or more than a threshold value, the image processing section 205 determines whether the output is a correct output of the subject image or the difference is due to the effect of noise, by referring to the 2D image data. Specifically, the corresponding pixel is determined by matching the parallax image data with the 2D image data, and it is determined how much each pixel differs from the peripheral pixels. When the difference is equal to or greater than a pre-set threshold value, the output of the particular pixel is determined as extraordinary. The output of the particular pixel determined as extraordinary is replaced with the pixel output of the 2D image data having been compared.

Figure 19:
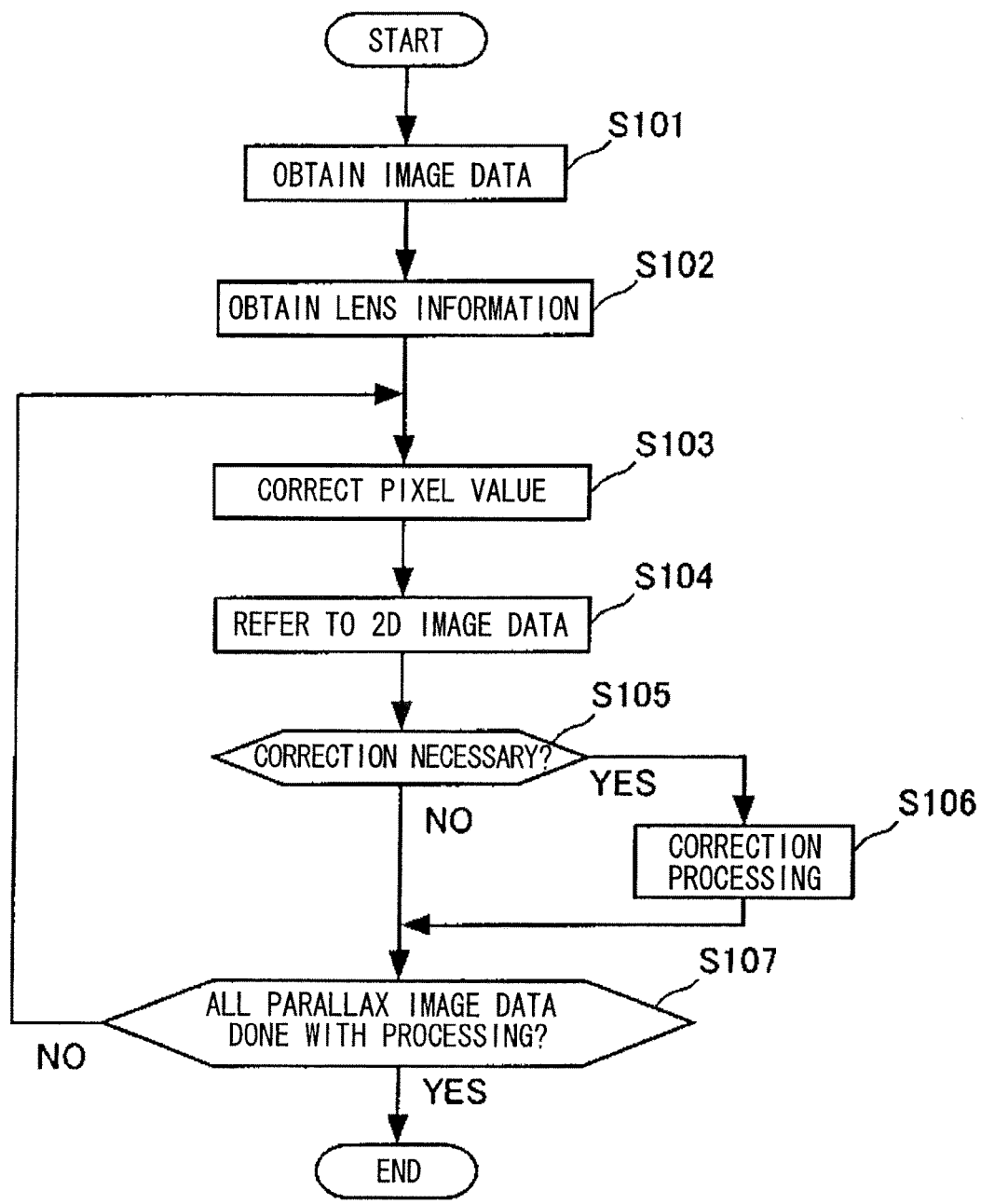
FIG. 19 shows a processing flow to correct color balance distortion.

Next, the correction processing flow is explained. FIG. 19 shows a processing flow to correct color balance distortion. The flow starts when the image capturing element 100 outputs an image signal after having finished the lithographic exposure operation, for example.

In Step S101, the image processing section 205 obtains L image data, R image data, and 2D image data. Note that for obtaining these types of image data, the image processing section 205 may either receive the image signals outputted from the image capturing element 100 and allocate each output of a pixel to three types of image data, or may read these types of image data from the memory card 220.

Then at Step S102, the control section 201 obtains the lens information from the lens memory 232 via the lens control section 231. When the already-captured image data is read from the memory card 220, the lens information can be obtained from the header information of the file. In addition, the image capturing element information is obtained from the header information because there is a possibility that the already-captured image data read from the memory card 220 has been captured by another digital camera 10. The image capturing element information is information of the image capturing element 100, and includes such information as the pixel arrangement information stated above and incident angle information of a principle light ray in each parallax pixel with respect to the reference lens unit 50.

In Step S103, the image processing section 205 executes correction processing to correct the pixel value of the L image data in the manner stated above. Furthermore, in Step S104, the matching processing is conducted to refer to the 2D image data. Specifically, a pixel of the L image data is compared to the corresponding pixel of the 2D image data, as stated above. When the abnormal output is determined in Step S105, the control proceeds to Step S106, in which correction processing is executed to replace with the corresponding pixel output of the 2D image data. When abnormal output is not determined in Step S105, or when the correction processing is finished in Step S106, the control proceeds to Step S107, and the control section 201 determines whether there is any parallax image data that require processing is left. In this particular example, the R image data is not processed yet, and so the control returns to Step S103, to execute processing to R image data. Once the processing to all the parallax image data is finished, the series of processing is ended. Note that also in the determination processing in Step S105, contour extraction may be performed to L image data, R image data, and 2D image data to divide the data into regions, and the change in the brightness caused by correcting the color and the transmittance may be corrected as long as the pixel falls in the same region. In this case, when there is no contradiction in similarity in the same region, it may be considered as normal output.

In the above-explained embodiment, the processing to the L image data and the R image data explained in FIG. 9 and the drawings thereafter may be adopted to the multi-parallax image data explained in the earlier section of the specification. For example when such parallax image data that gives parallax also in the longitudinal direction is outputted (refer to FIG. 7 and FIG. 8), the incident angle of the principle light ray to the color filter 102 may be converted to 0 not only in the x direction but also in the y direction. Of course, in a case where only parallax image data that gives parallax in the lateral direction is generated, the processing to convert the incident angle to 0 may be added.

In the above-explained embodiment, the digital camera 10 was taken as an example. However, not limited to during image capturing, the processing to correct color imbalance can also be executed after image capturing by reading each piece of image data. The correction processing may be pursued by such apparatuses as a personal computer. In such a case, a personal computer may be used as an image processing apparatus instead of the digital camera 10, which is an image capturing apparatus.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

What is claimed is:

1. An image processing apparatus, comprising:
a processor configured to perform operations including
obtaining at least a first piece of parallax image data and a second piece of parallax image data from an image capturing element that includes a plurality of pixels, each of which includes, in association with one micro-lens, one photoelectric conversion element that corresponds to only one color filter and to only one opening mask; and
correcting, for each pixel output in the first and second pieces of parallax image data, and based on an angle of light incident to each color filter of the pixels, a color imbalance resulting from differences in an amount of light received by the photoelectric conversion elements of the pixels that are caused by differences of at least one of (i) positions of the photoelectric conversion elements and (ii) opening displacements of the opening masks of the pixels,
wherein the opening masks of the pixels pass regions of incident light, while maintaining a relative positional relation with respect to the image capturing element, and
wherein the first piece of parallax image data and the second piece of parallax image data are from different view points.

2. The image processing apparatus according to claim 1, wherein:
the processor is further configured to obtain lens information of an image capturing lens at a time of obtaining the first and second pieces of parallax image data, and
correcting the color imbalance includes taking into consideration the lens information.

3. The image processing apparatus according to claim 2, wherein
the lens information includes pupil position information of the image capturing lens.

4. The image processing apparatus according to claim 2, wherein
the lens information includes diaphragm information at a time of obtaining the first and second pieces of parallax image data.

5. The image processing apparatus according to claim 2, wherein
the lens information includes transmittance information with respect to a diameter direction of a pupil of the image capturing lens.

6. The image processing apparatus according to claim 1, wherein:
the processor is further configured to obtain focus information at a time of obtaining the first and second pieces of parallax image data, and
correcting the color imbalance includes taking into consideration the focus information.

7. The image processing apparatus according to claim 1, wherein the processor is further configured to
obtain, from the image capturing element, non-parallax image data outputted together with the first and second pieces of parallax image data, and
further correct, for each pixel output in the first and second pieces of parallax image data, the color imbalance by referring to corresponding pixel outputs of the non-parallax image data.

8. An image capturing apparatus comprising an image processing apparatus according to claim 1 and the image capturing element, wherein
in the image capturing element, an opening of each of the opening masks provided to correspond to at least three of n adjacent photoelectric conversion elements (n being an integer equal to or greater than 3) is included in one of color filter patterns constituted by at least two types of the color filters that transmit wavelength regions different from each other, and is located to pass each of light fluxes from partial regions different from each other in a sectional area of incident light, and a group of photoelectric conversion elements made of the n adjacent photoelectric conversion elements are arranged periodically, and
the image capturing apparatus outputs at least the first piece of parallax image data and the second piece of parallax image data based on an output signal of the photoelectric conversion elements for which the opening masks are provided.

9. An image processing apparatus comprising:
a processor configured to perform operations including
obtaining at least a first piece of parallax image data and a second piece of parallax image data from an image capturing element that is at least partly constituted by parallax pixels, each of which includes, in association with one micro-lens, one photoelectric conversion element that corresponds to only one color filter and to only one opening mask; and
correcting, for each pixel output in the first and second pieces of parallax image data, and based on an angle of light incident to each color filter of the parallax pixels, a color imbalance resulting from differences in an amount of light received by the photoelectric conversion elements of the parallax pixels that are caused by differences of at least one of (i) positions of the parallax pixels and (ii) the angle of the light incident on the parallax pixels,
wherein the opening masks of the parallax pixels pass regions of incident light, while maintaining a relative positional relation with respect to the image capturing element, and
wherein the first piece of parallax image data and the second piece of parallax image data are from different view points.

10. The image processing apparatus according to claim 9, wherein
the incident angle for each of the parallax pixels is defined by an opening displacement of its opening mask.

11. The image processing apparatus according to claim 1, wherein the image capturing element includes at least two opening masks that each pass a different partial region of incident light.

12. The image processing apparatus according to claim 11, wherein the different partial regions of incident light include a left partial region and a right partial region.

13. The image processing apparatus according to claim 1, wherein a pixel output of the first piece of parallax image data and a corresponding pixel output of the second piece of parallax image data are output from a single minute region of the image capturing element.

14. The image processing apparatus according to claim 13, wherein the opening mask of the pixel outputting the pixel output of the first piece of parallax image data is adjacent to the opening mask of the pixel outputting the corresponding pixel output of the second piece of parallax image data.

15. The image processing apparatus according to claim 1, wherein the differences in the amount of light are based on a difference in the angle of incident light between a pixel outputting for the first piece of parallax image data and a corresponding pixel outputting for the second piece of parallax image data.

16. The image processing apparatus according to claim 15, wherein the processor is further configured to correct the color imbalance based on a thickness and an absorbing coefficient of the color filter of the pixel outputting for the first piece of parallax image data.

* * * * *